United States Patent
Leobandung et al.

(10) Patent No.: US 10,896,979 B2
(45) Date of Patent: Jan. 19, 2021

(54) COMPACT VERTICAL INJECTION PUNCH THROUGH FLOATING GATE ANALOG MEMORY AND A MANUFACTURE THEREOF

(71) Applicant: International Business Machines Corporation, Armonk, NY (US)

(72) Inventors: Effendi Leobandung, Yorktown Heights, NY (US); Yulong Li, Yorktown Heights, NY (US); Tak Ning, Yorktown Heights, NY (US); Paul Michael Solomon, Yorktown Heights, NY (US); Chun-Chen Yeh, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/718,099

(22) Filed: Sep. 28, 2017

(65) Prior Publication Data

US 2019/0097060 A1    Mar. 28, 2019

(51) Int. Cl.
| | | |
|---|---|---|
| H01L 29/788 | (2006.01) |
| H01L 29/423 | (2006.01) |
| H01L 29/10 | (2006.01) |
| H01L 29/08 | (2006.01) |
| H01L 29/06 | (2006.01) |
| H01L 21/265 | (2006.01) |
| H01L 21/306 | (2006.01) |
| H01L 21/762 | (2006.01) |
| H01L 29/66 | (2006.01) |
| H01L 21/28 | (2006.01) |

(52) U.S. Cl.
CPC .... *H01L 29/7885* (2013.01); *H01L 21/26513* (2013.01); *H01L 21/30604* (2013.01); *H01L 21/76224* (2013.01); *H01L 29/0653* (2013.01); *H01L 29/0847* (2013.01); *H01L 29/1095* (2013.01); *H01L 29/40114* (2019.08); *H01L 29/42328* (2013.01); *H01L 29/66825* (2013.01)

(58) Field of Classification Search
None
See application file for complete search history.

(56) References Cited

U.S. PATENT DOCUMENTS

| | | | |
|---|---|---|---|
| 6,157,058 A | 12/2000 | Ogura | |
| 6,734,490 B2 * | 5/2004 | Esseni | G11C 16/0416 257/314 |
| 6,914,288 B2 | 7/2005 | Itou et al. | |
| 7,019,353 B2 | 3/2006 | Lindsay et al. | |
| 7,372,091 B2 | 5/2008 | Leslie | |
| 7,443,736 B2 * | 10/2008 | Samachisa | G11C 16/10 365/185.02 |
| 7,453,118 B2 | 11/2008 | Tomii et al. | |
| 7,514,324 B2 | 4/2009 | Leslie | |
| 7,619,279 B2 | 11/2009 | Lindsay et al. | |

(Continued)

*Primary Examiner* — Long Pham
(74) *Attorney, Agent, or Firm* — L. Jeffrey Kelly, Esq.; McGinn IP Law Group, PLLC (57) ABSTRACT

A vertical injection punchthrough based metal oxide semiconductor (VIPMOS) device and method of manufacturing the same, include a control gate, an erase gate, a floating gate, and an active area where the control gate, the erase gate, and the floating gate are coplanar and perpendicular to the active area.

15 Claims, 8 Drawing Sheets

(56) References Cited

U.S. PATENT DOCUMENTS

| | | | |
|---|---|---|---|
| 2002/0033499 A1* | 3/2002 | Esseni | H01L 27/11521 257/315 |
| 2006/0275962 A1* | 12/2006 | Lee | H01L 29/792 438/152 |
| 2007/0217264 A1* | 9/2007 | Samachisa | G11C 16/10 365/185.19 |
| 2009/0310427 A1* | 12/2009 | Park | H01L 27/115 365/185.29 |
| 2010/0032744 A1* | 2/2010 | Mitros | H01L 29/66825 257/316 |
| 2016/0079251 A1* | 3/2016 | Li | H01L 29/45 257/316 |
| 2018/0012898 A1* | 1/2018 | Wu | H01L 29/7883 |
| 2018/0047738 A1* | 2/2018 | Richter | H01L 27/11546 |
| 2018/0145085 A1* | 5/2018 | Liu | H01L 27/11534 |

* cited by examiner

COMPACT VERTICAL INJECTION PUNCH THROUGH FLOATING GATE ANALOG MEMORY AND A MANUFACTURE THEREOF

BACKGROUND

The present invention relates generally to a floating gate manufacturing method, and more particularly, but not by way of limitation, to a system, method, and computer program product for a compact vertical injection punch through a floating gate analog memory and a method of manufacture thereof.

Conventionally, vertical injection punchthrough-based MOS (VIPMOS) devices are based on an n+ metal oxide semiconductor (NMOS) transistor. The gate is left floating, and a control gate is placed on top of the floating gate. An n-type buried injector is formed under the floating gate by, for example, high-energy ion implantation. The output voltage is continuously available also during programming and is linearly dependent on the program time. During programming only crosstalk of the program current and not of the enable pulse is measured on the output. This makes it possible to program the circuit with a feedback loop. The program current has to be made dependent on the difference of the measured and desired output potential. After the desired output potential is reached, programming can be disabled.

However, conventional VIPMOS devices are large and do not allow contact to the floating gate, erase gate, and/or control gate.

SUMMARY

In an exemplary embodiment, the present invention can provide a vertical injection punchthrough based MOS (VIPMOS) device, including a control gate, an erase gate, a floating gate, an active area, where the control gate, the erase gate, and the floating gate are coplanar and perpendicular to the active area. One or more other exemplary embodiments include a computer program product and a system.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways that should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

The invention will now be described with reference to FIGS. 1-2L, in which like reference numerals refer to like parts throughout. It is emphasized that, according to common practice, the various features of the drawings are not necessarily to scale. On the contrary, the dimensions of the various features can be arbitrarily expanded or reduced for clarity.

Figure 1:
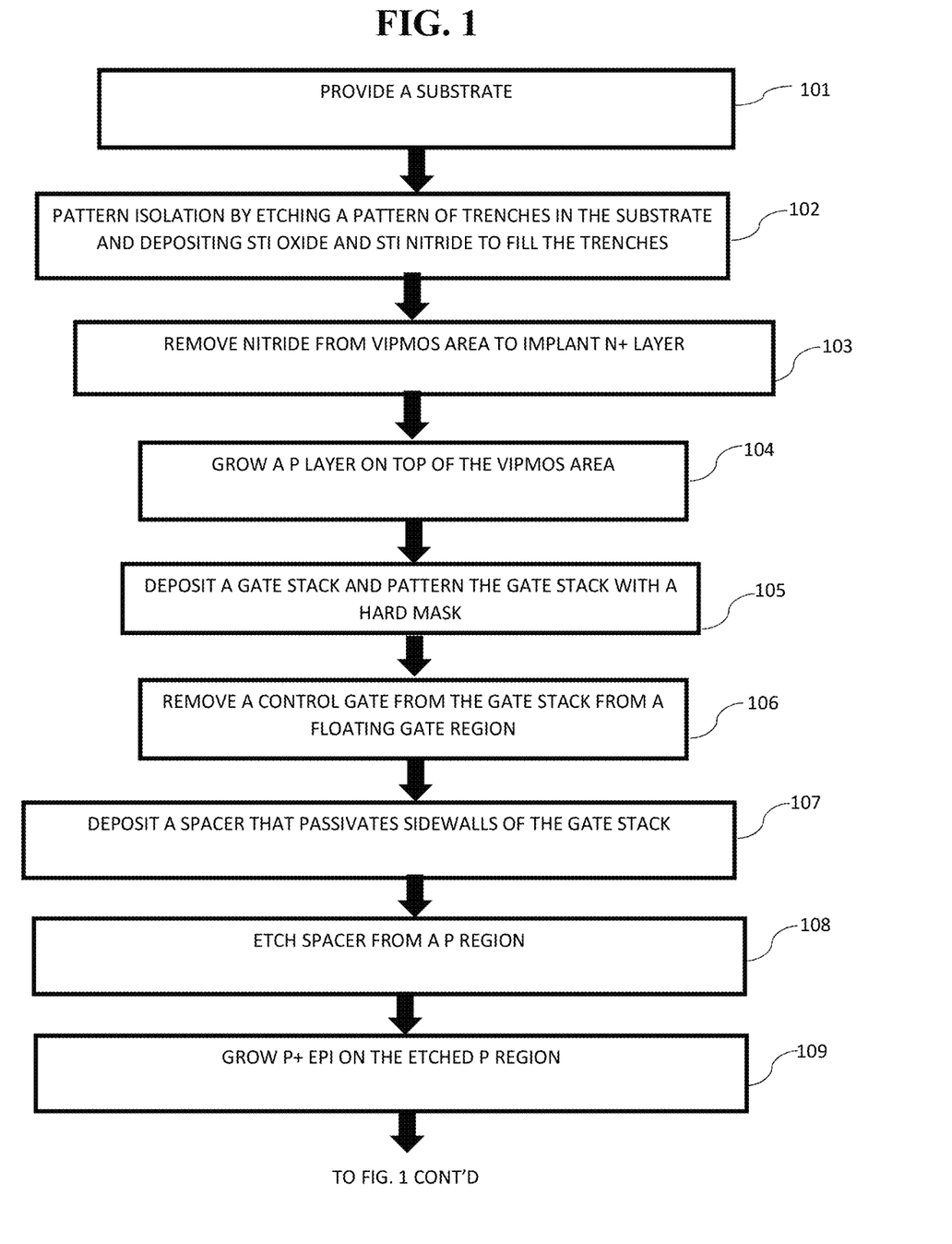
FIG. 1 exemplarily shows a high-level flow chart for a floating gate manufacturing method 100 according to an embodiment of the present invention.
Figure 2A:
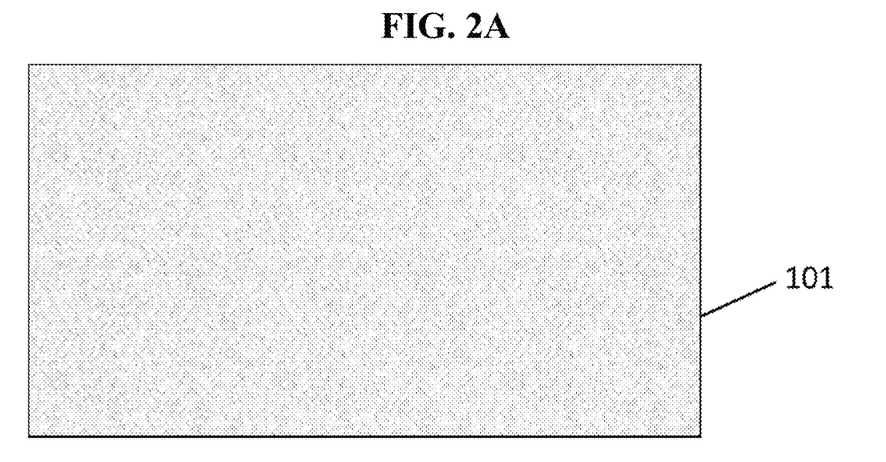
FIGS. 2A-2L exemplarily depict a VIPMOS device and method of manufacturing thereof according to an embodiment of the present invention.
Figure 2B:
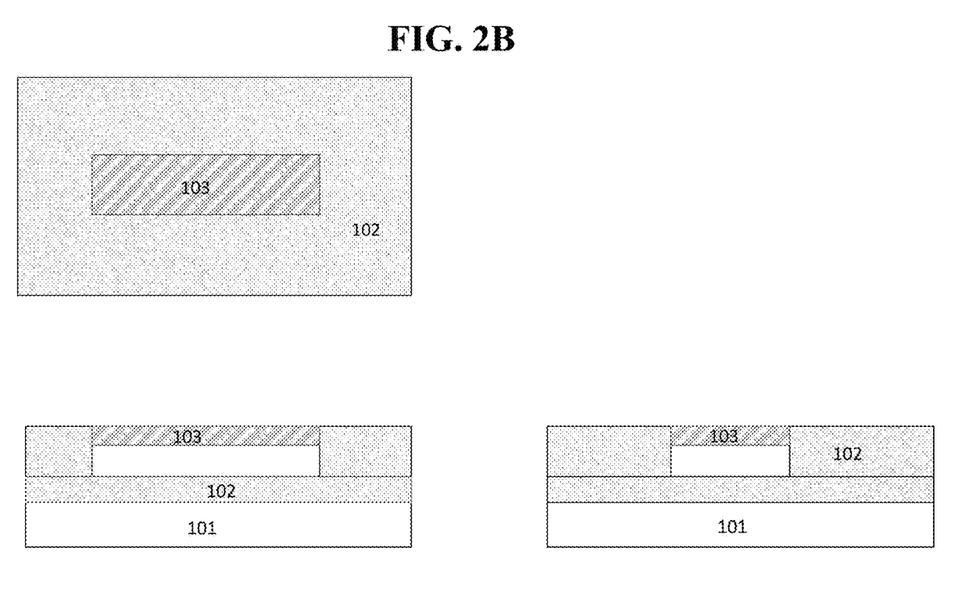
Figure 2C:
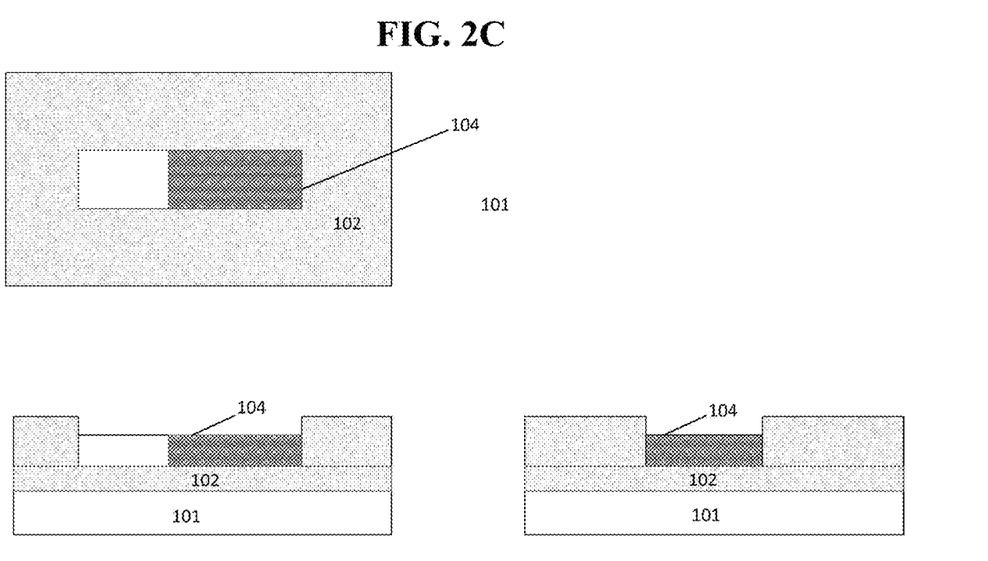
Figure 2D:
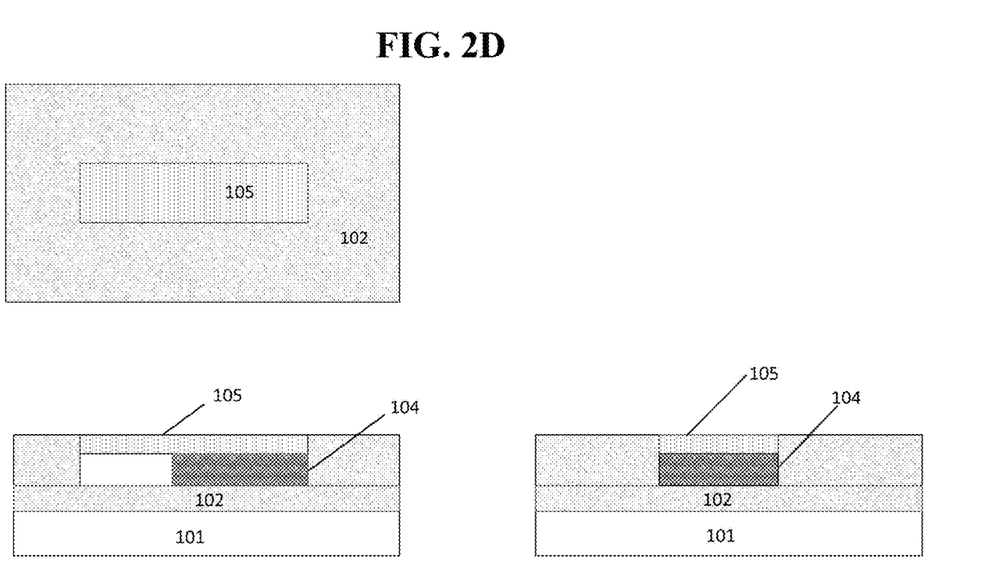
Figure 2E:
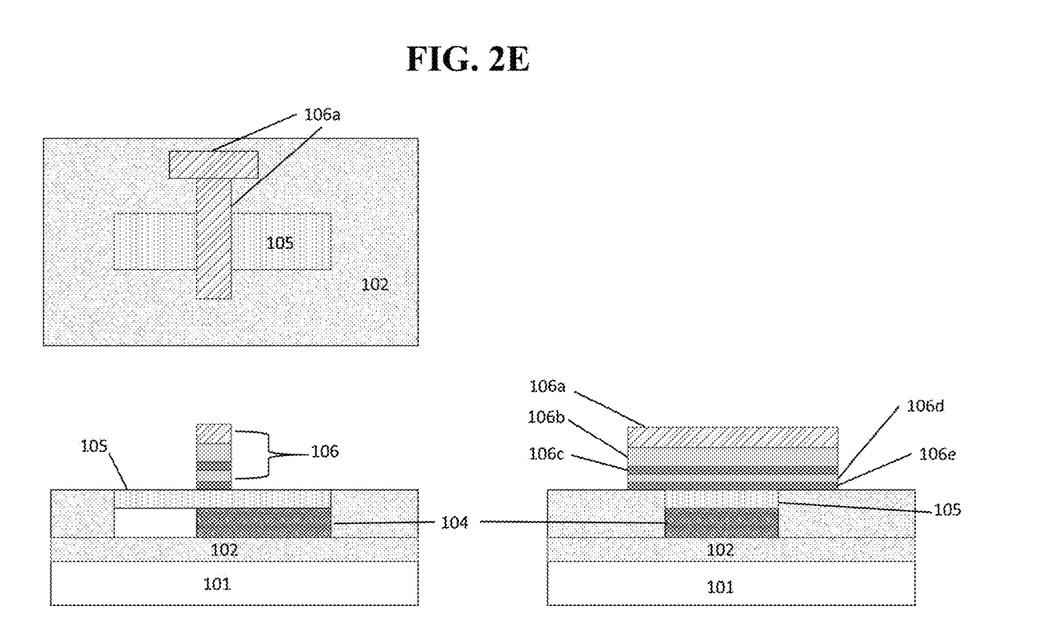
Figure 2F:
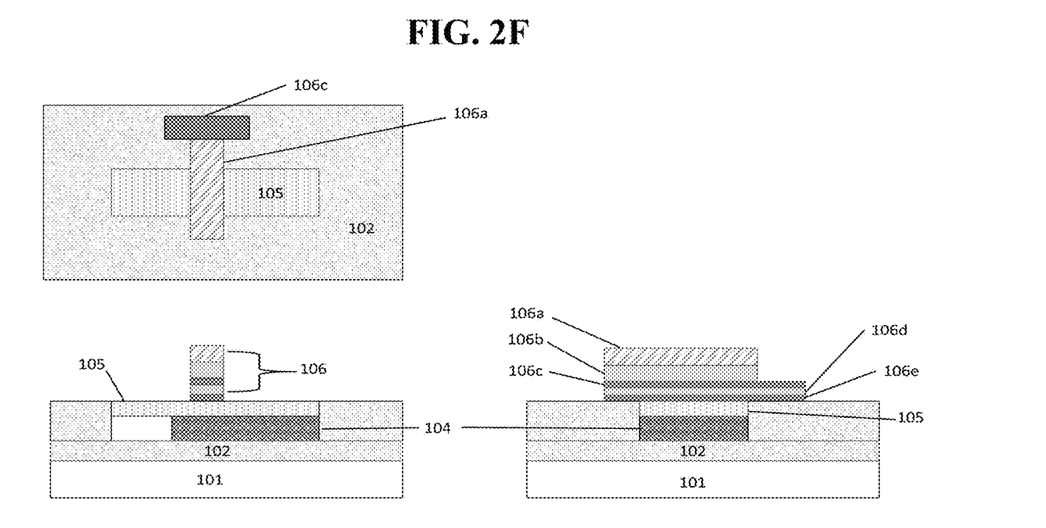
Figure 2G:
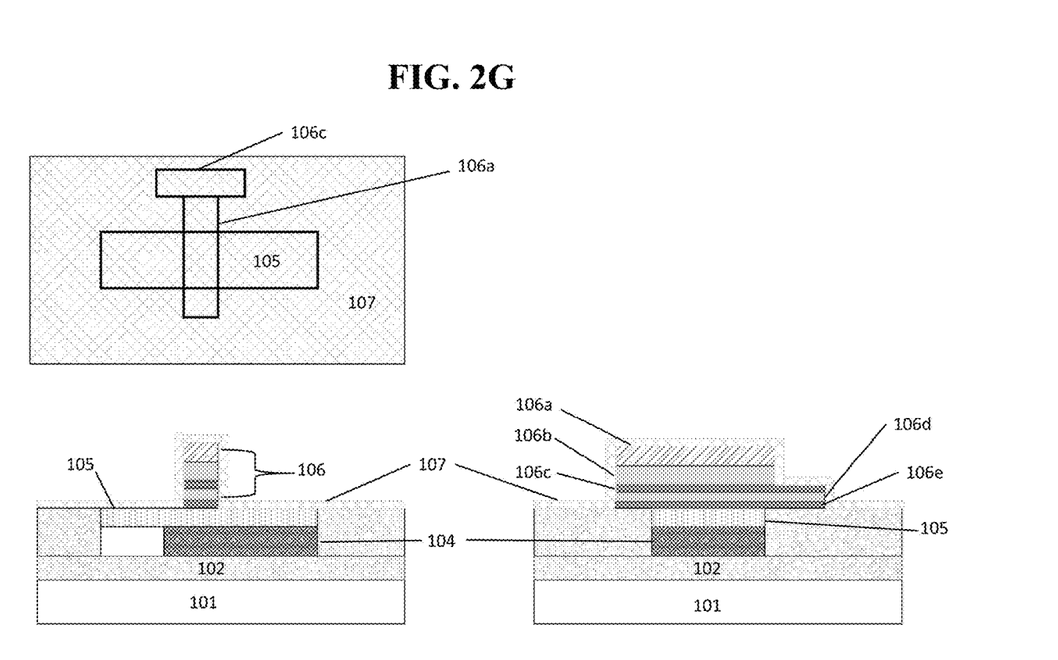
Figure 2H:
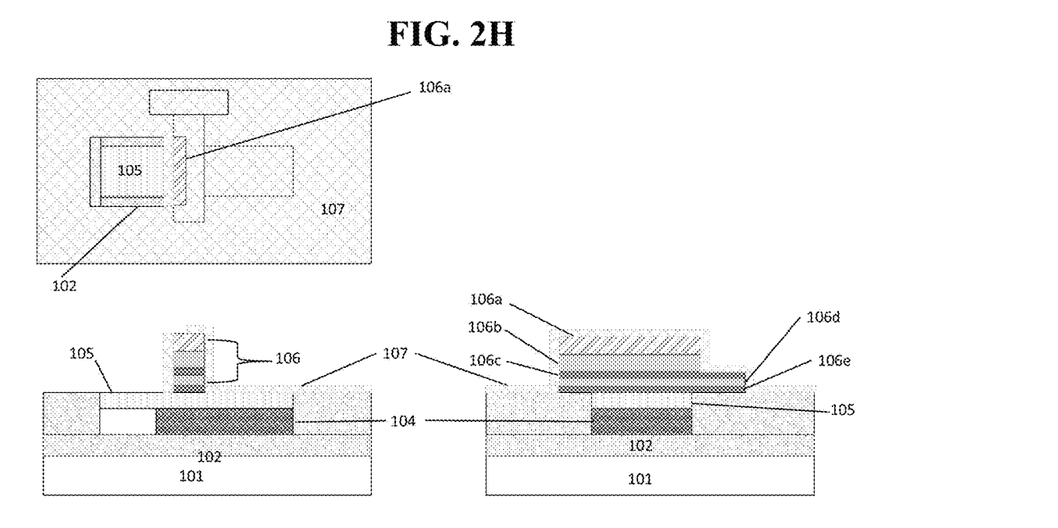
Figure 2I:
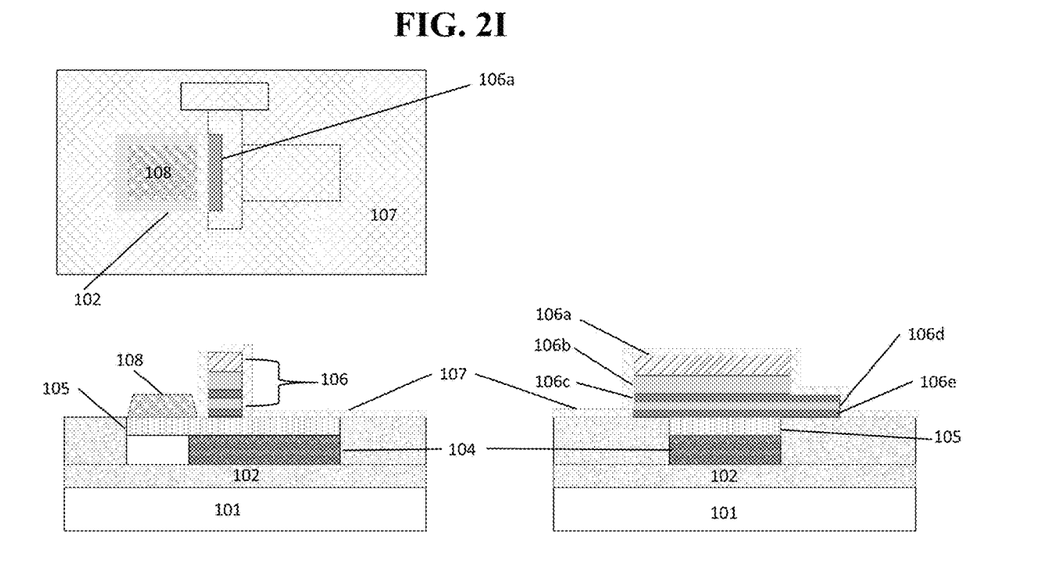
Figure 2J:
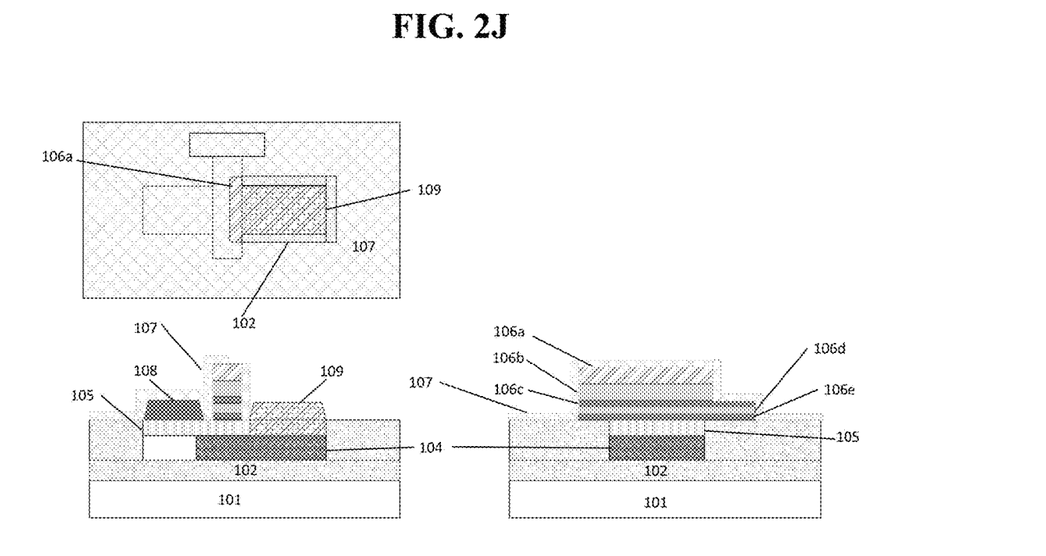
Figure 2K:
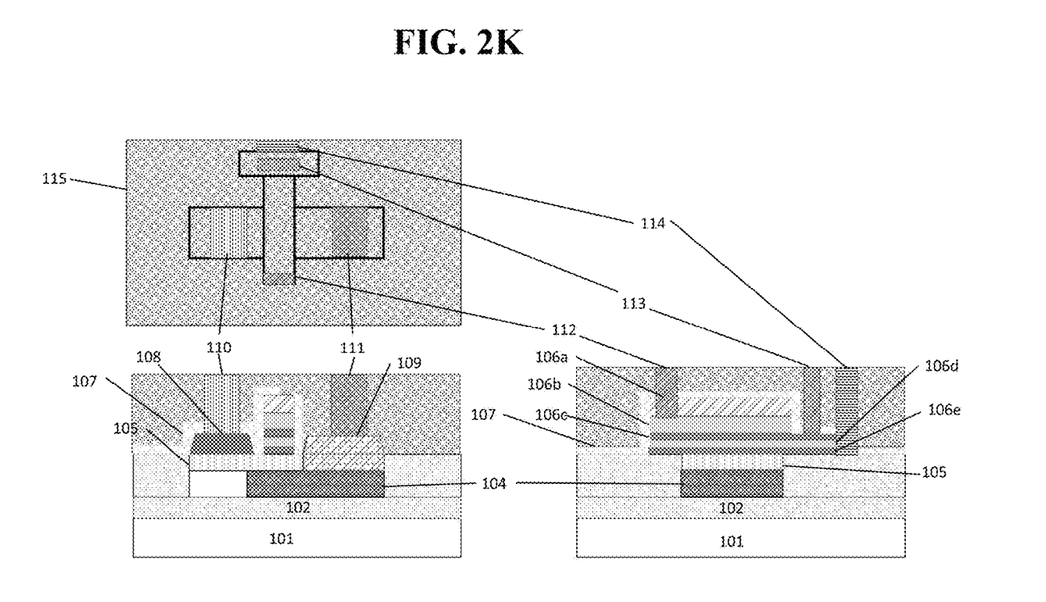
Figure 2L:
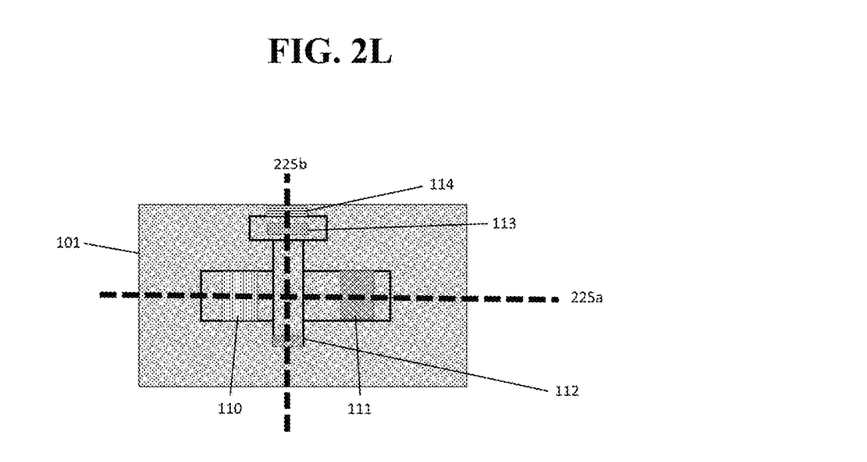

Referring to FIG. 1, FIG. 1 describes a flow of the method of manufacturing of the VIPMOS device corresponding to FIGS. 2A-2L.

In step 101 and as shown in FIG. 2A, a silicon-on-insulator (SOI) substrate or bulk silicon substrate 101 is provided.

In step 102 and as shown in FIG. 2B, pattern isolation is performed by etching a pattern of trenches in the substrate 101 and depositing shallow trench isolation (STI) nitride 103 and STI oxide 102 to fill the trenches. Excess dielectric is removed using a technique, such as chemical-mechanical polishing (planarization).

In step 103 and as shown in FIG. 2C, the STI nitride 103 is removed from a VIPMOS area to implant an N+ layer 104. A nitride etchant removes the parts of the nitride 103 to etch away and remove the nitride 103 to expose the substrate 101. The N+ layer 104 is implanted on the substrate.

In step 104 and as shown in FIG. 2D, a p-layer 105 is grown on top of the VIPMOS area on the N+ layer 104.

In step 105 and as shown in FIG. 2E, a gate stack 106 is deposited. The gate stack 106 includes a hard mask 106a of nitride which may be approximately 30 nm thick, a gate 106b such as W or a doped polysilicon approximately 30 nm thick, a top gate 106c of oxide/high-k approximately 4 nm thick, a floating gate 106d of W or polysilicon approximately 30 nm thick, and a bottom gate 106e of oxide/high-k material approximately 4 nm thick. The gate stack 106 is perpendicular to the p-layer. For purposes of the present invention, a material having a dielectric constant greater than 3.9.

In step 106 and as shown in FIG. 2F, the hard mask 106a and the gate 106b are removed from a floating gate region of the gate stack 106.

In step 107 and as shown in FIG. 2G, a spacer 107 is deposited over an entirety of the upper surface of the device.

In step 108 and as shown in FIG. 2H, the spacer 107 is etched from a p region such that the oxide 102 and the p-layer 105 are exposed.

In step 109 and as shown in FIG. 2I, a p+ EPI layer 108 is grown on the etched p region.

In step 110 and as shown in FIG. 2J, the spacer 107 is deposited again over the p+ EPI 108 and the spacer 107 is etched from an N+ region such that the N+ layer 104 is exposed. In step 111, an N layer is implanted and an N+ EPI layer 109 is grown in the etched N+ region.

In step 112 and as shown in FIG. 2K, an inter-layer dielectric 115 is deposited and planarized. Contacts are made for a drain 110, an injector 111, a control gate 112, an erase gate 113, and a floating gate 114. A line passing through a center point of each of the control gate, the erase gate, and the floating gate is perpendicular to a line passing through a center point of each of the injector and the drain. The injector and the drain are located on a same isolation island and a line passing through the injector and drain is perpendicular to the plane of the control gate, the erase gate, and the floating gate. That is, the control gate, the erase gate, and the floating gate are coplanar (i.e., a plane intersects a center point of each and the plane being perpendicular to the active area).

The erase gate 113, control gate 112 and floating gate 114 connection are located perpendicular to the substrate 101 so to save space for dense integration. As exemplarily depicted in FIG. 2L, a line 225*b* intersecting the control gate 112, the erase gate 113, and the floating gate 114 is perpendicular to a line 225*a* through the substrate 101 at the active area (P region and n+ region exposed in steps 108 and 110).

Also, the injector 111 and the drain 110 are located on a same isolation island and not a separate isolation island so as to save space and for dense integration.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A vertical injection punchthrough-based metal oxide semiconductor (VIPMOS) device, comprising:
    a substrate including a VIPMOS area;
    a control gate disposed on the VIPMOS area;
    an erase gate disposed on the VIPMOS area;
    a floating gate disposed on the VIPMOS area; and
    a congruent single active area formed on the VIPMOS area having contacts formed therein, the single active area including an injector and a drain;
    wherein the control gate, the erase gate, and the floating gate are stacked on the single active area and each have a different contact to the single active area, via the contacts,
    wherein the control gate, the erase gate, and the floating gate are coplanar and perpendicular to the single active area,
    wherein the single active area is directly connected, via the contacts formed in the single active area, to each of the control gate, the erase gate, and the floating gate.

2. The device of claim 1, the injector having the control gate interposed therebetween in a plane view of the VIPMOS.

3. The device of claim 2, wherein a line passing through the injector and drain is perpendicular to the plane of the control gate, the erase gate, and the floating gate.

4. The device of claim 2, wherein the injector and the drain are disposed other than on a separate isolation island.

5. The device of claim 1, wherein a line passing through a center point of each of the control gate, the erase gate, and the floating gate is perpendicular to a line parallel to a width direction of the active area.

6. The device of claim 2, wherein a line passing through a center point of each of the control gate, the erase gate, and the floating gate is perpendicular to a line passing through a center point of each of the injector and the drain.

7. The device of claim 2, wherein the control gate, the erase gate, and the floating gate are non-coplanar to the injector and the drain.

8. A neural network, comprising:
    a vertical injection punchthrough-based metal oxide semiconductor (VIPMOS) device, the device including:
        a substrate including a VIPMOS area,
        a control gate disposed on the VIPMOS area;
        an erase gate disposed on the VIPMOS area;
        a floating gate disposed on the VIPMOS area; and
        a congruent single active area formed on the VIPMOS area having contacts formed therein, the single active area including an injector and a drain;
    wherein the control gate, the erase gate, and the floating gate are stacked on the single active area and each have a different contact to the single active area via the contacts,
    wherein the control gate, the erase gate, and the floating gate are coplanar and perpendicular to the single active area,
    wherein the single active area is directly connected, via the contacts formed in the single active area, to each of the control gate, the erase gate, and the floating gate.

9. The neural network of claim 8, wherein the active area includes:
    a drain; and
    an injector having the control gate interposed therebetween in a plane view of the VIPMOS.

10. The neural network of claim 9, wherein a line passing through the injector and drain is perpendicular to the plane of the control gate, the erase gate, and the floating gate.

11. The neural network of claim 9, wherein the injector and the drain are disposed other than on a separate isolation island.

12. The neural network of claim 8, wherein a line passing through a center point of each of the control gate, the erase gate, and the floating gate is perpendicular to a line parallel to a width direction of the active area.

13. The neural network of claim 9, wherein a line passing through a center point of each of the control gate, the erase gate, and the floating gate is perpendicular to a line passing through a center point of each of the injector and the drain.

14. The neural network of claim 9, wherein the control gate, the erase gate, and the floating gate are non-coplanar to the injector and the drain.

15. The vertical injection punchthrough-based metal oxide semiconductor device of claim 1, wherein the control gate, the erase gate, and the floating gate are stacked one on top of the other and are perpendicular to a top surface of the substrate, the top surface of the substrate having the exposed contacts.

* * * * *